United States Patent
Steuer et al.

(10) Patent No.: US 9,506,966 B2
(45) Date of Patent: Nov. 29, 2016

(54) OFF-CENTER SENSOR TARGET REGION

(71) Applicant: Google Technology Holdings LLC, Mountain View, CA (US)

(72) Inventors: Paul R Steuer, Hawthorn Woods, IL (US); Thomas Y Merrell, Beach Park, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 176 days.

(21) Appl. No.: 13/803,771

(22) Filed: Mar. 14, 2013

(65) Prior Publication Data

US 2014/0267133 A1   Sep. 18, 2014

(51) Int. Cl.
*G06F 3/041* (2006.01)
*G01R 27/26* (2006.01)
*G06F 3/0488* (2013.01)

(52) U.S. Cl.
CPC ......... *G01R 27/2605* (2013.01); *G06F 3/0414* (2013.01); *G06F 3/0418* (2013.01); *G06F 3/04886* (2013.01)

(58) Field of Classification Search
CPC .......... G06F 3/14; G06F 3/041; G06F 3/044; G06F 3/048; G06F 3/0488; G06F 3/0416; G06F 3/055; G06F 3/045; G06F 3/0414; G06F 3/0418; G09G 5/00
USPC ....... 345/174, 660, 173; 715/765; 178/18.03
See application file for complete search history.

(56) References Cited

U.S. PATENT DOCUMENTS

| | | | |
|---|---|---|---|
| 7,136,051 B2 | 11/2006 | Hein et al. | |
| 8,099,209 B2 | 1/2012 | Tschirhart | |
| 2006/0238517 A1 | 10/2006 | King et al. | |
| 2008/0196945 A1* | 8/2008 | Konstas | 178/18.03 |
| 2009/0174679 A1* | 7/2009 | Westerman | 345/173 |
| 2010/0107099 A1* | 4/2010 | Frazier et al. | 715/765 |
| 2011/0018835 A1 | 1/2011 | Murai et al. | |
| 2011/0164060 A1* | 7/2011 | Miyazawa et al. | 345/660 |
| 2012/0182238 A1* | 7/2012 | Lee | G06F 3/0418 345/173 |
| 2012/0287076 A1* | 11/2012 | Dao et al. | 345/174 |
| 2013/0038540 A1 | 2/2013 | Adnerson et al. | |
| 2013/0038548 A1 | 2/2013 | Kitada et al. | |
| 2014/0028575 A1* | 1/2014 | Parivar | G06F 3/0414 345/173 |

OTHER PUBLICATIONS

International Search Report for PCT Patent Application No. PCT/US2014/017257, mailed on May 15, 2014, 4 pages.

* cited by examiner

*Primary Examiner* — Nicholas Lee
*Assistant Examiner* — Abdul-Samad A Adediran
(74) *Attorney, Agent, or Firm* — Brake Hughes Bellermann LLP

(57) ABSTRACT

In embodiments of an off-center sensor target region, a capacitive sensor can include a target region that is located off-center relative to a center of the sensor. A touch input to the target region of the capacitive sensor can be determined to be valid sensor input and a touch contact that correlates to the center of the capacitive sensor can be determined to be false sensor input. The target region of the capacitive sensor can correspond to a selectable control that is selectable by a user to initiate a device function.

25 Claims, 7 Drawing Sheets

2

OFF-CENTER SENSOR TARGET REGION

BACKGROUND

Computer devices, tablet computers, mobile phones, entertainment devices, navigation devices, and other electronic devices are increasingly designed with touch-sensitive controls, such as "buttons" implemented using capacitive sensors, that facilitate user-selectable touch inputs. For example, a user can input a selection on a touch-sensitive control of a device, such as with a finger, and initiate a device function that corresponds to the touch-sensitive control. However, when a device such as a mobile phone is placed in a user's pocket, the user's leg or other objects in the user's pocket may make incidental contact with touch-sensitive controls of the device, but initiating device functions responsive to this incidental contact may not be desired.

BRIEF DESCRIPTION OF THE DRAWINGS

Embodiments of an off-center sensor target region are described with reference to the following Figures. The same numbers are used throughout to reference like features and components that are shown in the Figures.

DETAILED DESCRIPTION

In embodiments of an off-center sensor target region, a capacitive sensor includes a target region located off-center relative to a center of the capacitive sensor. For example, the target region can be located off-center relative to a center of the capacitive sensor in one or both of an x-direction and a y-direction. A touch input to the target region of the capacitive sensor is determinable as a valid sensor input and a touch contact that correlates to the center of the capacitive sensor is determinable as a false sensor input. Additionally, the target region of the capacitive sensor can correspond to a selectable control of a device. Device functions can be initiated when a touch input to the selectable control correlates to a valid sensor input.

In embodiments, a sensor input module can determine a center of a touch input that is detected by a capacitive sensor having an off-centered target region. The sensor input module can then compare the center of the touch input to a center of the off-centered target region of the capacitive sensor. If the center of the touch input correlates to the center of the target region, the sensor input module can determine that the touch input is a valid sensor input. Additionally, the sensor input module can compare the center of the touch input to a center of the capacitive sensor. If the center of the touch input correlates to the center of the capacitive sensor, the sensor input module can determine that the touch input is false sensor input.

While features and concepts of an off-center sensor target region can be implemented in any number of different devices, systems, and/or configurations, embodiments of an off-center sensor target region are described in the context of the following example devices, systems, and methods.

Figure 1:
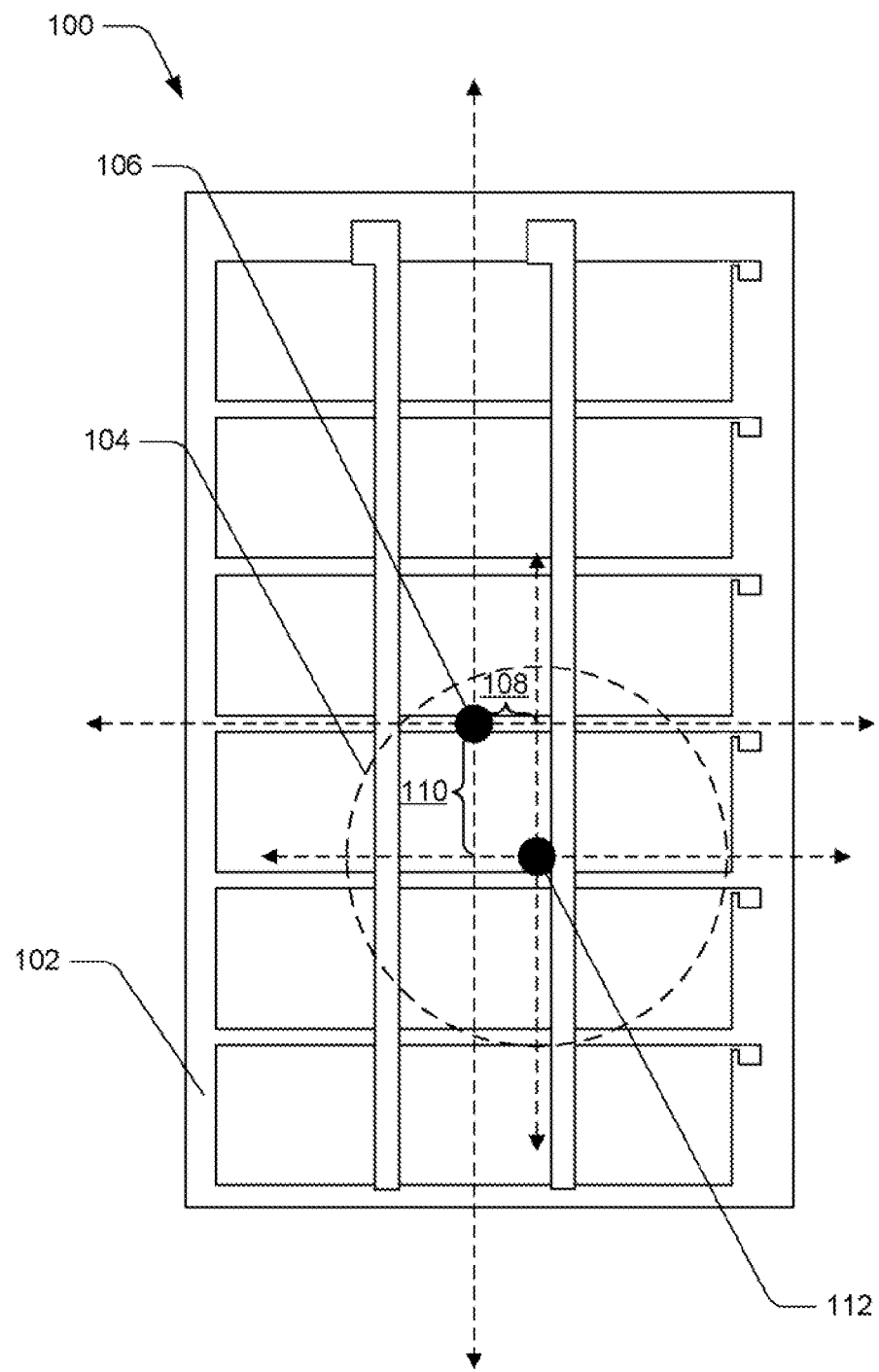
FIG. 1 illustrates an example of a sensor with an off-center sensor target region in accordance with one or more embodiments.

FIG. 1 illustrates an example 100 of a sensor 102 with an off-center sensor target region. The example sensor 102 can be implemented as a capacitive sensor to detect and measure capacitive inputs, such as touch inputs to the capacitive sensor, touch contacts, proximate touch contacts, and the like. For example, the capacitive sensor 102 can be implemented to detect and measure touch input to a selectable control of a device in which the sensor is included.

The example sensor 102 includes a target region 104 indicated by a dashed line and illustrated in the shape of a circle. Touch inputs detected by the capacitive sensor 102 to the target region 104 can be determined as valid sensor inputs, and touch inputs or contacts to other portions of the sensor can be determined as false sensor inputs. Although depicted as a circle, the target region 104 of the capacitive sensor 102 may be shaped in a variety of different ways. For example, the target region 104 may be triangular, rectangular, square, pentagonal, elliptical, comprise a rounded shape (e.g., a rounded triangle or a rounded rectangle), and so on. The shape of the target region 104 may also be longer or shorter along one axis (e.g., an x-axis) of the shape than along another axis (e.g., a y-axis) of the shape. The shape of the target region 104 may be different than a shape of the capacitive sensor 102 in some embodiments, yet in other embodiments the shape of the target region may be the same as the shape of the sensor.

Although the target region 104 may have the same shape as the capacitive sensor 102, it is does not comprise an entirety of the sensor. Instead, the target region 104 comprises only a portion of the capacitive sensor 102. In general, the target region 104 is configured, which includes sized, based on a desired input to the capacitive sensor. In particular, the target region 104 may be configured to be larger than a contact area associated with the desired input to the capacitive sensor. For example, when touch input by a fingertip to a "button" is desired, the target region 104 may be configured to be larger than a contact area associated with fingertip inputs to the particular button.

In some conventional techniques, capacitive sensors are used that are smaller (e.g., 2 mm×2 mm) than the contact area associated with a desired input (e.g., a touch input by a fingertip). Thus, in these techniques the contact area associated with the desired input may generally cover the capacitive sensor. However, contact areas of incidental contacts (e.g., from a whole hand or a leg) may also cover the capacitive sensor. Consequently, a center of a desired input or an incidental contact that covers the capacitive sensor may be determined to correlate to a center of the capacitive sensor as desired input. Thus, these conventional techniques may be unsuitable for using a contact center to distinguish between desired input and incidental contact.

In contrast, when a capacitive sensor is larger than a desired input, a contact area of the desired input may cover only a portion of the capacitive sensor. Further, the center determined for a desired input may correlate to a portion of the capacitive sensor covered by the contact area of the desired input, which may not correlate to the center of the capacitive sensor. In other words, a capacitive sensor that is larger than a desired input enables a center to be determined for the desired input that is off-center relative to the center of the capacitive sensor.

The example sensor 102 includes the target region 104 that is located off-center relative to a center of the sensor 106. For example, the target region 104 of the example sensor 102 can be located off-center relative to the center of the capacitive sensor 106 in an x-direction 108 from the center of the sensor. Alternately, the target region 104 of the example sensor 102 can be located off-center relative to the center of the capacitive sensor 106 in a y-direction 110 from the center of the sensor. In embodiments, the target region 14 of the example sensor 102 can be located off-center relative to the center of the capacitive sensor 106 in both an x-direction 108 and a y-direction 110 from the center of the sensor.

In the illustrated example, the target region 104 is depicted with its corresponding center 112. The center 112 of the target region 104 can be used to determine whether touch contact detected by the capacitive sensor 102 is valid sensor input. For example, the center 112 of the target region 104 can be compared to a center of a contact area of touch contact, and if the centers are determined to match, the touch contact can be determined as a valid sensor input. On the other hand, the touch contact is not a valid sensor input if the centers do not match. Rather, the touch contact is a false sensor input if the center of the touch contact does not match the center 112 of the target region 104.

The center of the capacitive sensor 106 may also be used in determining whether touch contact detected by the sensor is valid sensor input, by comparing the center of the sensor to a center of a contact area of the touch contact. For example, a touch contact detected by the capacitive sensor 102 is not a valid sensor input if a center of a contact area of the touch contact is determined to correlate to the center of the capacitive sensor 106. Rather, the touch contact is a false sensor input if the center of the touch contact correlates to the center of the capacitive sensor 106. On the other hand, touch contact that does not correlate to the center of the capacitive sensor 106 can be determined to be a valid sensor input.

Although the target region 104 of the capacitive sensor 102 is shown in FIG. 1 as being offset relative to the center of the capacitive sensor 106, in some embodiments the target region may be offset relative to another portion of the capacitive sensor. For example, the target region 104 of the capacitive sensor 102 may be offset relative to a particular location on the capacitive sensor 102 that does not correspond to the center of the capacitive sensor 106. In embodiments, the target region 104 can be offset relative to the particular location in an x-direction from the particular location. Alternately, the target region 104 can be offset relative to the particular location in a y-direction from the particular location. Further, the target region 104 can be offset relative to the particular location in both an x-direction and a y-direction from the particular location.

As with the center of the capacitive sensor 106, the particular location may be used in determining whether touch contact detected by the capacitive sensor 102 is valid sensor input, by comparing the particular location of the capacitive sensor to a center of a contact area of the touch contact. For example, a touch contact detected by the capacitive sensor 102 is not a valid sensor input if a center of a contact area of the touch contact is determined to correlate to the particular location. Rather, the touch contact is a false sensor input if the center of the touch contact correlates to the particular location.

In embodiments, the target region 104 of the capacitive sensor 102 corresponds to a selectable control for selection by a user to initiate a function of a device, such that a touch input which is determined to be a valid sensor input may initiate the device function. However, a touch contact which is determined to be a false sensor input (e.g., when the touch contact's center correlates to the center of the sensor) does not initiate the device function.

Figure 2:
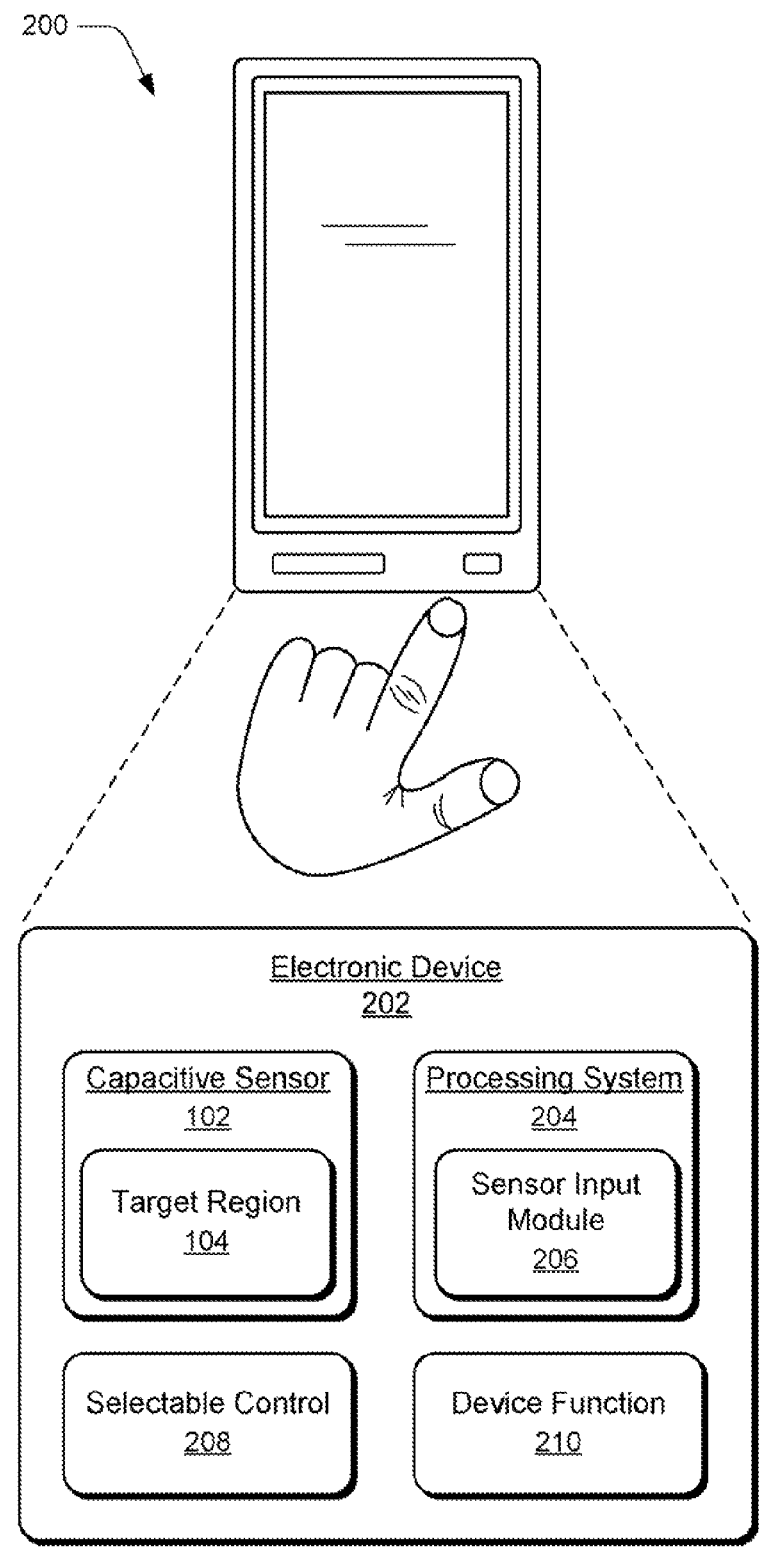
FIG. 2 illustrates an example system in which embodiments of an off-center sensor target region can be implemented.

FIG. 2 illustrates an example system 200 in which embodiments of an off-center sensor target region can be implemented. The example system 200 includes a electronic device 202, which may be any one or combination of a fixed or mobile device, in any form of a desktop computer, portable computer, tablet computer, mobile phone, media player, eBook, navigation device, gaming device, gaming controller, remote controller, digital camera, video camera, etc. The electronic device 202 includes the capacitive sensor 102 with the off-centered target region 104 as described with reference to FIG. 1. Any of the electronic devices can be implemented with various components, such as one or more processors and memory devices, as well as any number and combination of differing components as further described with reference to the example electronic device shown in FIG. 8.

The capacitive sensor 102 is implemented to sense and/or detect touch contacts and touch inputs on the capacitive sensor. In the example system 200, the electronic device 202 has a processing system 204 that includes a sensor input module 206. The sensor input module 206 can be implemented as computer-executable instructions, such as a software application, and executed by one or more processors of the processing system 204 to implement various aspects of an off-center sensor target region. For example, the sensor input module 206 is implemented to receive sensor inputs that correspond to the touch contacts and touch inputs detected by the capacitive sensor 102.

In general, the sensor input module 206 is implemented to determine if the touch contacts and touch inputs detected by the capacitive sensor 102 correspond to valid sensor inputs or false sensor inputs. To do so, the sensor input module 206 can be implemented to determine a center of a touch input or contact detected by the capacitive sensor 102 based on a contact area of the touch input or contact on the capacitive sensor. For example, the sensor input module 206 may be implemented to approximate a contact area of the touch input or contact using a square, and then use a center of the square as the center of the touch input or contact. It should be noted that the sensor input module 206 may be implemented to employ any of a variety of techniques to determine or approximate the center of a touch input or contact.

Further, the sensor input module 206 can be implemented to compare the center of a touch input or contact to a center of the target region 104. Based on the comparison, the sensor input module 206 is implemented to determine whether the touch input or contact is a valid sensor input. For example, the sensor input module 206 can be implemented to determine that the touch input or contact is a valid sensor input if the center of the touch input or contact correlates to the center of the target region 104. The sensor input module 206 can also be implemented to determine that the touch input or contact is not a valid sensor input if the center of the touch input or contact does not correlate to the center of the target region 104. If the center of the touch input or contact does not correlate to the center of the target region 104, the sensor input module 206 can be implemented to determine that the touch input or contact is a false sensor input and consequently, ignore the touch input or contact.

Similarly, the sensor input module 206 can be implemented to compare the center of a touch contact to the center of the capacitive sensor 106. Based on the comparison, the sensor input module 206 is implemented to determine whether the contact corresponds to a false sensor input and, if it does, ignore the touch contact. For example, the sensor input module 206 can be implemented to determine that the touch contact is a false sensor input if the center of the touch contact correlates to the center of the capacitive sensor 106. If the center of the touch contact does not correlate to the center of the capacitive sensor 106, the sensor input module 206 may be implemented to determine that the touch contact is a valid sensor input.

When a touch input or contact is a valid sensor input, the processing system 204 is implemented to initiate a device function. In the example system 200, the electronic device 202 includes a selectable control 208 that can be selected by a user to initiate a device function 210. Although only one selectable control 208 and device function 210 are depicted, the electronic device 202 may have multiple selectable controls and corresponding device functions. In embodiments, the selectable control 208 can be implemented for user selection to initiate the device function 210, which may be any one or a combination of device functions. For example, the selectable control 208 can be implemented for user selection to initiate a volume change for the electronic device 202, turn on/off a light of the electronic device, launch a browser (or other) application on a display screen of the electronic device, scroll through content displayed by the electronic device, initiate a network connection with one or more other devices, and so on.

Figure 6:
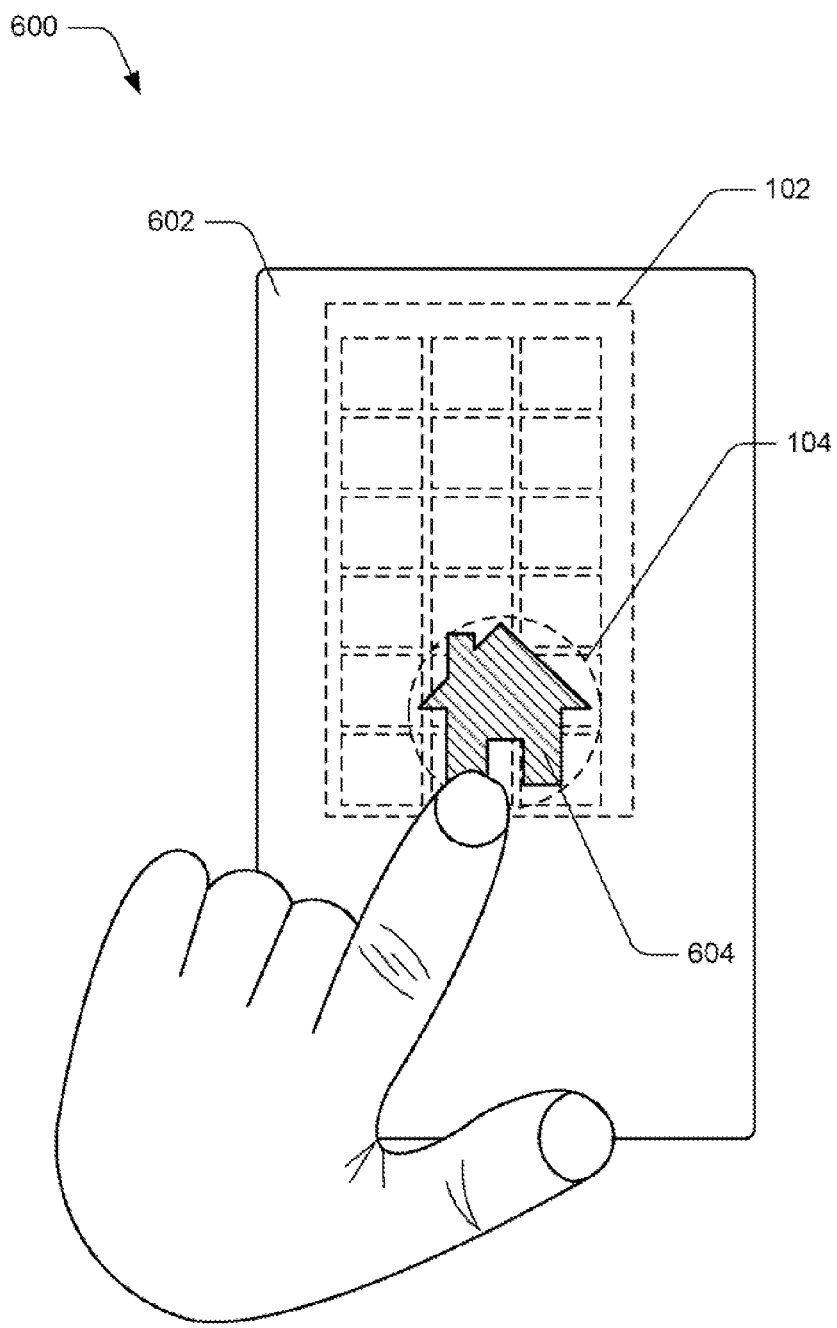
FIG. 6 illustrates another example system in which embodiments of an off-center sensor target region can be implemented, and depicts a selectable control comprising a visual indicator located at an off-center target region of a sensor.

The selectable control 208 can be implemented as any selectable feature of the electronic device 202. For example, the selectable control 208 can be implemented to include a tactile feature, such as a dimple, a raised bump, a trough, or any other physical feature on a surface of the electronic device 202 that a user may contact to initiate the device function 210. In other embodiments, the selectable control 208 may not be a feature that is raised or depressed from the surface of the electronic device 202. In other words, the selectable control 208 may not be a feature that results in a changed surface topology of the electronic device 202 at the location of the selectable control. For example, the selectable control 208 can be implemented to include a visual indicator, such as an icon integrated into the surface of the electronic device 202 or a light-emitting diode (LED). In embodiments of an off-center sensor target region, the selectable control 208 may be implemented as any one or a combination of different indicators. An example of a visual indicator is shown in FIG. 6, which depicts a "home" on a back side of a device as the selectable control.

In any case, the selectable control 208 and the capacitive sensor 102 of the electronic device 202 are arranged so that touch input to the selectable control is detected by the capacitive sensor. In particular, the selectable control 208 and the capacitive sensor 102 are arranged so that the selectable control corresponds to the target region 104 of the capacitive sensor. For example, the electronic device 202 can be arranged so that the selectable control 208 is located at the target region 104 of the capacitive sensor 102. Thus, when a user touches (e.g., with a fingertip) the selectable control 208, the capacitive sensor 102 can detect a touch input on the target region 104.

Figure 3:
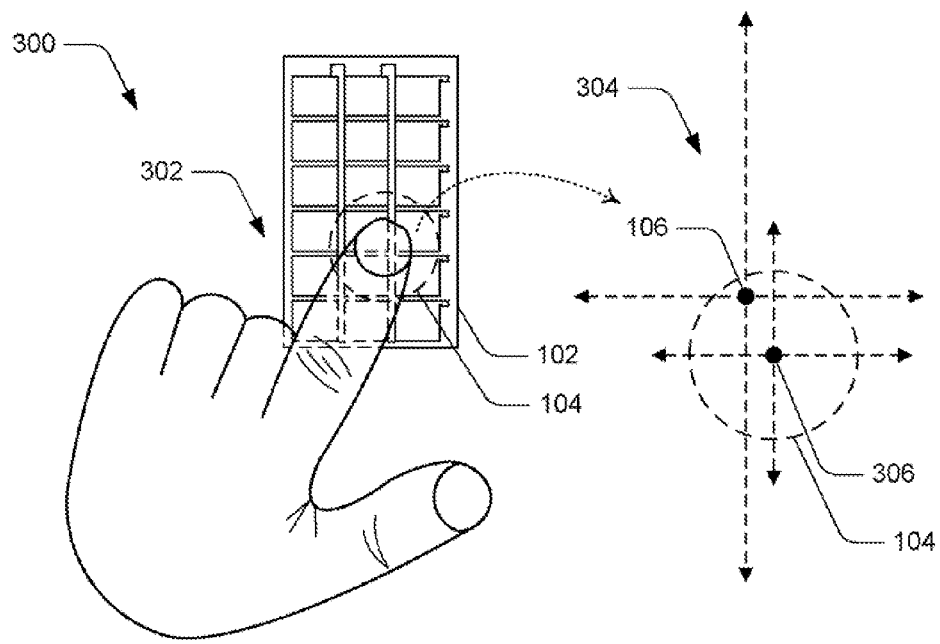
FIG. 3 illustrates a representation of a touch input to an off-center target region of a sensor that is determinable as a valid input to the sensor, and a comparison of a center of the touch input to a center of the sensor.

FIG. 3 illustrates a representation 300 of a touch input to an off-center target region of a sensor that is determinable as a valid input to the sensor, and a comparison of a center of the touch input to a center of the sensor. An example of a touch input is shown at 302, such as where a user selects with a fingertip a selectable control located over the capacitive sensor 102. In the example at 302, the fingertip of the user is located at the target region 104 of the capacitive sensor 102.

At 304, a comparison of a center of the touch input 306 to a center of the capacitive sensor 106 is shown. The center of a touch input 306 can be determined in a variety of ways from a contact area of the touch input on the capacitive sensor 102, as previously discussed. In the comparison at 304, the center of the touch input 306 is depicted in substantially a same location as a center of the target region 104. Accordingly, the center of the touch input 306 correlates to the center of the target region 104. In the comparison at 304, the center of the touch input 306 correlates to the center of the target region 104 because the centers match. However, the center of another touch input need not match the center of the target region to correlate to the center of the target region. For example, the center of another touch input may correlate to the center of the target region 104 if within a predetermined distance of the target region's center. However, if the center of the touch input is beyond the predetermined distance, the center of the touch input may be determined not to correlate to the center of the target region 104.

In the comparison at 304, the center of the touch input 306 is also depicted a distance away from the center of the sensor. Accordingly, the center of the touch input 306 does not correlate to the center of the capacitive sensor 106. The example touch input shown at 302 may correspond to a valid sensor input because the center of the touch input 306 correlates to the center of the target region 104 and/or because the center of the touch input does not correlate to the center of the capacitive sensor 106.

Figure 4:
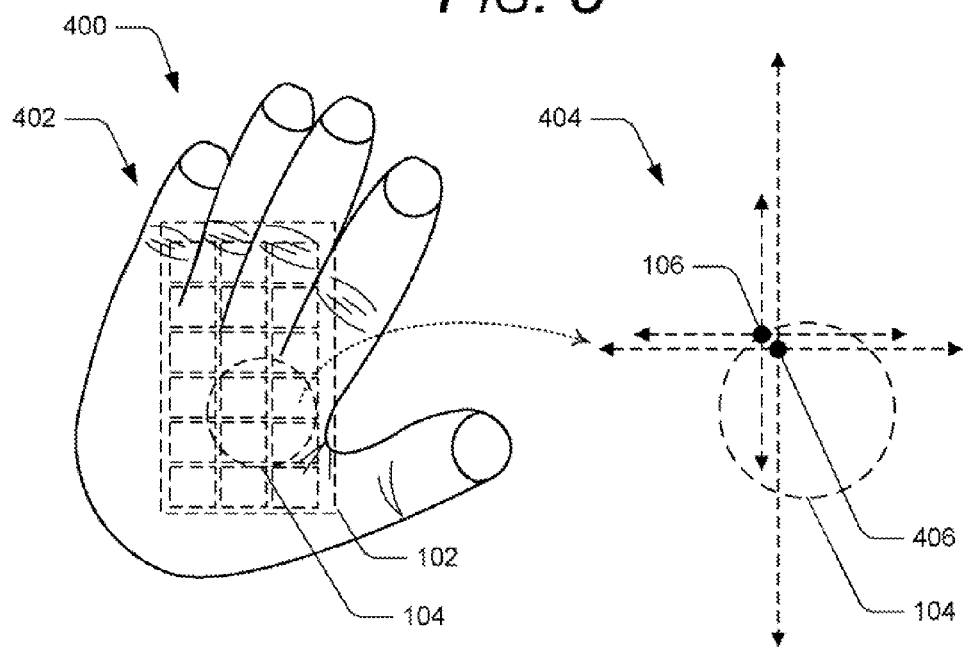
FIG. 4 illustrates a representation of a touch contact to a sensor that is determinable as a false input to the sensor, and a comparison of a center of the touch contact to a center of the sensor.

FIG. 4 illustrates a representation 400 of a touch contact to a sensor that is determinable as a false input to the sensor, and a comparison of a center of the touch contact to a center of the sensor. An example of a touch contact is shown at 402, such as where a user's hand incidentally covers the capacitive sensor 102 while holding a handheld device that includes the capacitive sensor. In the example at 402, the hand of the user covers most of the capacitive sensor 102 including the target region 104 of the capacitive sensor.

At 404, a comparison of a center of the touch contact 406 to the center of the capacitive sensor 106 is shown. The center of the touch contact 406 can be determined from a contact area of the touch contact on the capacitive sensor 102. The center of the touch contact 406 is determined to be near, but does not match, the center of the capacitive sensor 106 in part because the touch contact does not completely cover the capacitive sensor 102 (there is a small uncovered portion). In the comparison at 404, the center of the touch contact 406, is depicted near the center of the capacitive sensor 106.

Although the center of the touch contact 406 does not match the center of the capacitive sensor 106, the center of the touch contact can be determined to correlate to the center of the capacitive sensor. For example, a center of a touch contact may correlate to the center of the capacitive sensor 106 if within a predetermined distance from the center of the capacitive sensor. The capacitive sensor 102 can be implemented to detect another touch contact that covers an entirety of the capacitive sensor, the center of which is determined to match the center of the capacitive sensor 106, and thus correlated to the center of the capacitive sensor. The example touch contact shown at 402 does not correspond to a valid sensor input because the center of the touch contact 406 correlates to the center of the capacitive sensor 106. Instead, the touch contact shown at 402 corresponds to a false sensor input because the center of the touch contact 406 correlates to the center of the capacitive sensor 106.

As discussed previously, the touch contact shown in the example at 402 covers most of the capacitive sensor 102 including the target region 104 of the capacitive sensor. Accordingly, the example touch contact shown at 402 may also be determined to correspond to a false sensor input for the additional reason that a contact area of the touch contact extends beyond a boundary of the target region 104, covering most of the capacitive sensor 102. In contrast, a touch contact that corresponds to a valid sensor input may have a contact area that does not extend beyond (e.g. outside of) the boundary of the target region 104.

Figure 5:
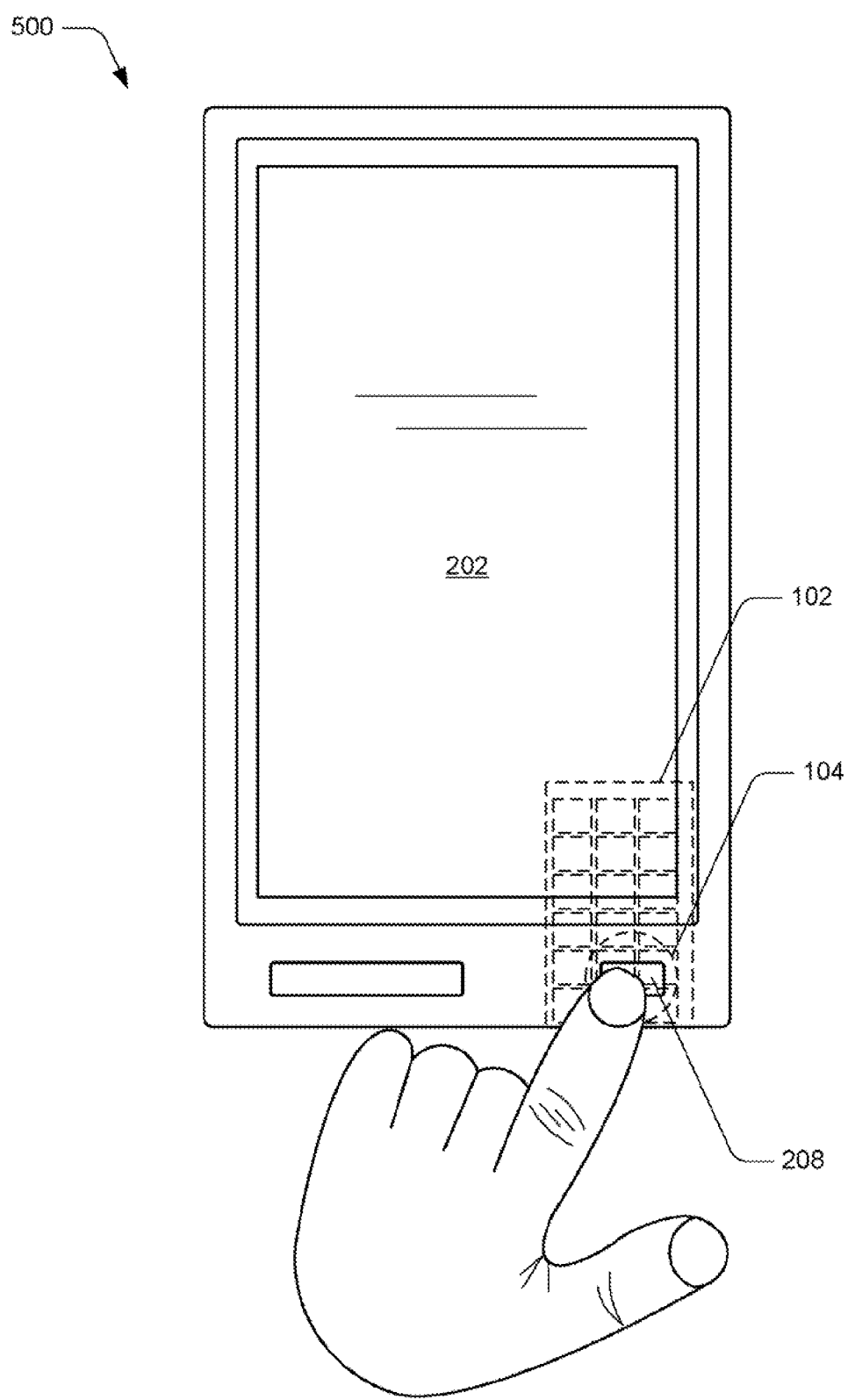
FIG. 5 illustrates another example system in which embodiments of an off-center sensor target region can be implemented, and depicts a selectable control located at an off-center target region of a sensor.

FIG. 5 illustrates another example system 500) in which embodiments of an off-center sensor target region can be implemented. The example system 500 includes the electronic device 202 with the selectable control 208 that corresponds to the capacitive sensor 102 and that is located at the off-center target region 104 of the sensor. The selectable control 208 and the capacitive sensor 102 with the off-center target region 104 may be implemented as described with reference to the corresponding features of FIGS. 1-4.

In embodiments, the capacitive sensor 102 is located within the electronic device 202, such as embedded within a housing of the electronic device or positioned under a surface of the electronic device. For example, the capacitive sensor 102 may be located under or behind the selectable control 208. In particular, the off-center target region 104 of the capacitive sensor 102 may be located opposite a touching surface of the selectable control 208. Although the off-center target region 104 is off-centered relative to a center of the capacitive sensor 102, and the selectable control 208 is located at the off-centered target region, the arrangement of these components may not be perceptible to a user of the electronic device 202 because the sensor can be covered by the selectable control and/or the surface of the electronic device. In any case, the capacitive sensor 102 may be implemented to receive a touch input to the off-center target region 104 when the user contacts the selectable control 208. The processing system 204 of the electronic device 202 may be implemented to initiate a function that corresponds to the selectable control 208 if touch input to the off-center target region 104 is determined to be valid sensor input.

FIG. 6 illustrates another example system 600 in which embodiments of an off-center sensor target region can be implemented. The example system 600 includes an electronic device 602 with the capacitive sensor 102. The example system 600 also includes a selectable control 604 that corresponds to the capacitive sensor 102 and is located at the off-center target region 104 of the capacitive sensor. The capacitive sensor 102 with the off-center target region 104 may be implemented as described with reference to the corresponding features of FIGS. 1-4.

As discussed previously, the selectable control 604 can be implemented as a visual indicator on the device. For example, the selectable control 604 can be implemented as a visual indicator, such as an icon integrated into the surface of the electronic device 602, a light-emitting diode (LED), and the like. In the example system 600, the selectable control 604 is depicted as a "home". The "home" may be located on a back side of the electronic device 602 (e.g., opposite a front side that includes a display screen). Further, the "home" may be implemented as an icon that is integrated into a surface of the back side of the electronic device 602. In embodiments, the capacitive sensor 102 may be located under or behind the selectable control 604, implemented as a visual indicator and located on the back side of the electronic device 602. When a touch input is made to the selectable control 604 shown as the "home", the electronic device 602 may be configured to display a home page on a display screen located on the front side of the device.

Example method 700 is described with reference to FIG. 7 in accordance with implementations of an off-center sensor target region. Generally, any of the services, components, modules, methods, and operations described herein can be implemented using software, firmware, hardware (e.g., fixed logic circuitry), manual processing, or any combination thereof. The example methods may be described in the general context of executable instructions stored on computer-readable storage media that is local and/or remote to a computer processing system, and implementations can include software applications, programs, functions, and the like.

Figure 7:
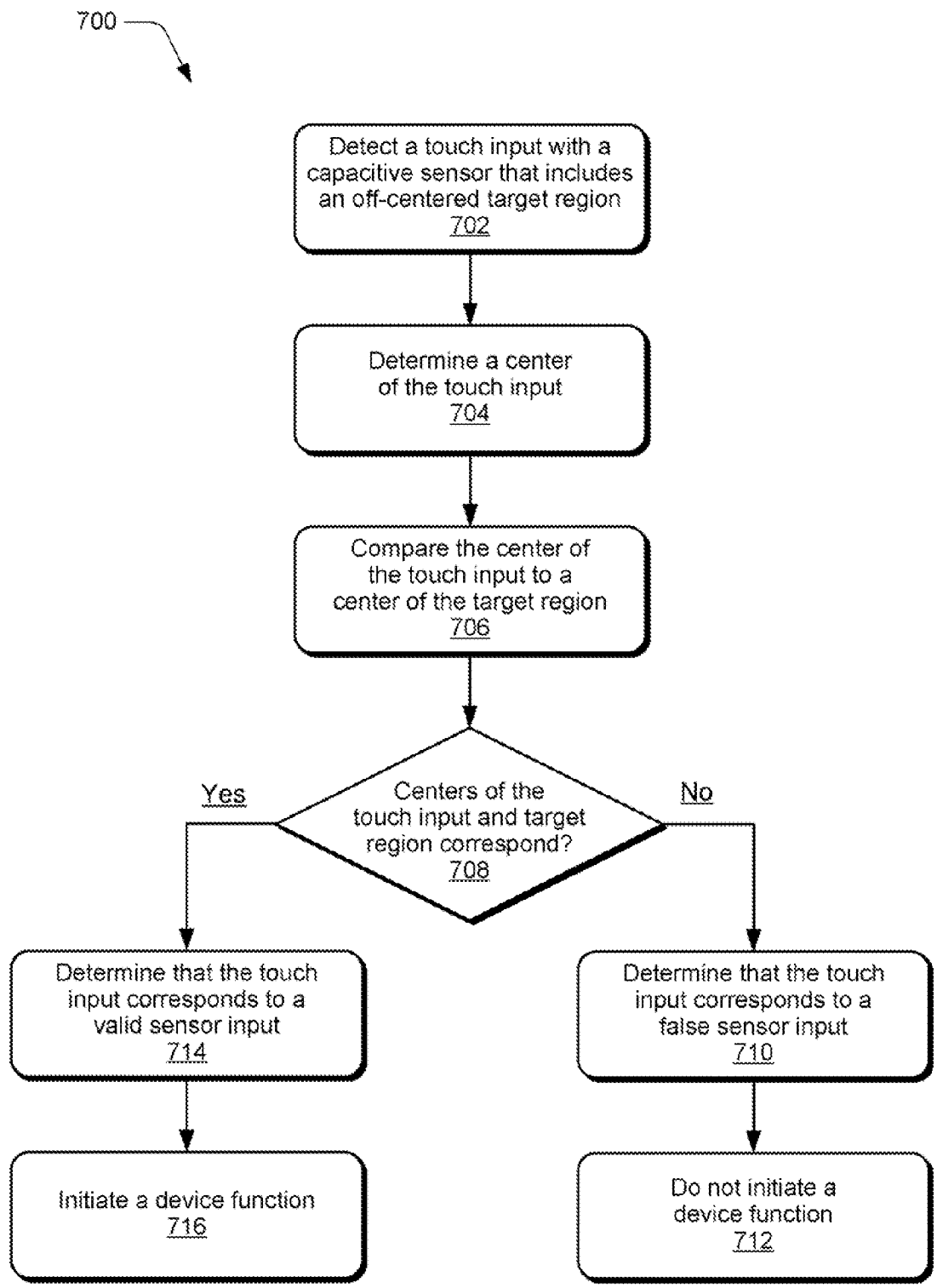
FIG. 7 illustrates example method(s) of an off-center sensor target region in accordance with one or more embodiments.

FIG. 7 illustrates example method(s) 700 of an off-center sensor target region. The order in which the method is described are not intended to be construed as a limitation, and any number or combination of the described method operations can be performed in any order to implement a method, or an alternate method.

At 702, a touch input is detected with a capacitive sensor that includes an off-centered target region. For example, the touch input shown at 302 (FIG. 3) is detected by the capacitive sensor 102, which includes the target region 104 that is off-center relative to the center of the capacitive sensor 106. The touch input shown at 302 may be detected by the capacitive sensor 102 responsive to user contact with a selectable control that corresponds to the capacitive sensor.

At 704, a center of the touch input is determined. For example, the sensor input module 206 (FIG. 2) determines the center of touch input 306 determined for the touch input shown at 302. The center of the touch input 306 may be determined by the sensor input module 206 based on a contact area of the touch input and responsive to detection of the touch input by the capacitive sensor 102. As discussed above, a center of a touch input or contact may be determined in a variety of ways, such as by approximating the contact area of the touch input and using the center of the approximated contact area.

At block 706, the center of the touch input is compared to a center of the off-centered target region of the capacitive sensor. For example, the center of the touch input 306 is compared by the sensor input module 206 to a center of the target region 104, which is off-centered relative to the center of the capacitive sensor 106.

At block 708, a determination is made as to whether the center of the touch input corresponds to the center of the off-centered target region. For example, the sensor input module 206 determines if the center of the touch input 306 correlates to the center of the target region 104 of the capacitive sensor 102. If the center of the touch input does not correspond to the center of the off-centered target region of the capacitive sensor (i.e. "no" from block 708), then at block 710, the touch input is determined to correspond to a false sensor input. For example, when the sensor input module 206 receives sensor input for the touch contact shown at 402, the sensor input module determines that the center of the touch contact 406 does not correlate to the center of the target region 104, which is off-center relative to the center of the capacitive sensor 106. Based on the determination that the center of the touch contact 406 does not correlate to the center of the capacitive sensor 106, the sensor input module 206 determines that the touch contact shown at 402 corresponds to a false sensor input. Further, at block 712, a device function is not initiated when the touch input corresponds to false sensor input. For example, the device function 210 is not initiated responsive to the determination that the touch contact shown at 402 is a false sensor input. Instead, the touch contact shown at 402 is ignored based on the determination.

If the center of the touch input does correspond to the center of the off-centered target region of the capacitive sensor (i.e., "yes" from block 708), then at block 714, the touch input is determined to correspond to a valid sensor input. For example, the sensor input module 206 determines that the center of the touch input 306 corresponds to the center of the target region 104 of the capacitive sensor 102. Based on the determination that the center of the touch input 306 correlates to the center of the target region 104, the sensor input module 206 determines that the touch input shown at 302 corresponds to a valid sensor input. Further, at block 716, a device function is initiated when the touch input corresponds to a valid sensor input. For example, the device function 210 is initiated responsive to the determination that the touch input shown at 302 is a valid sensor input.

Figure 8:
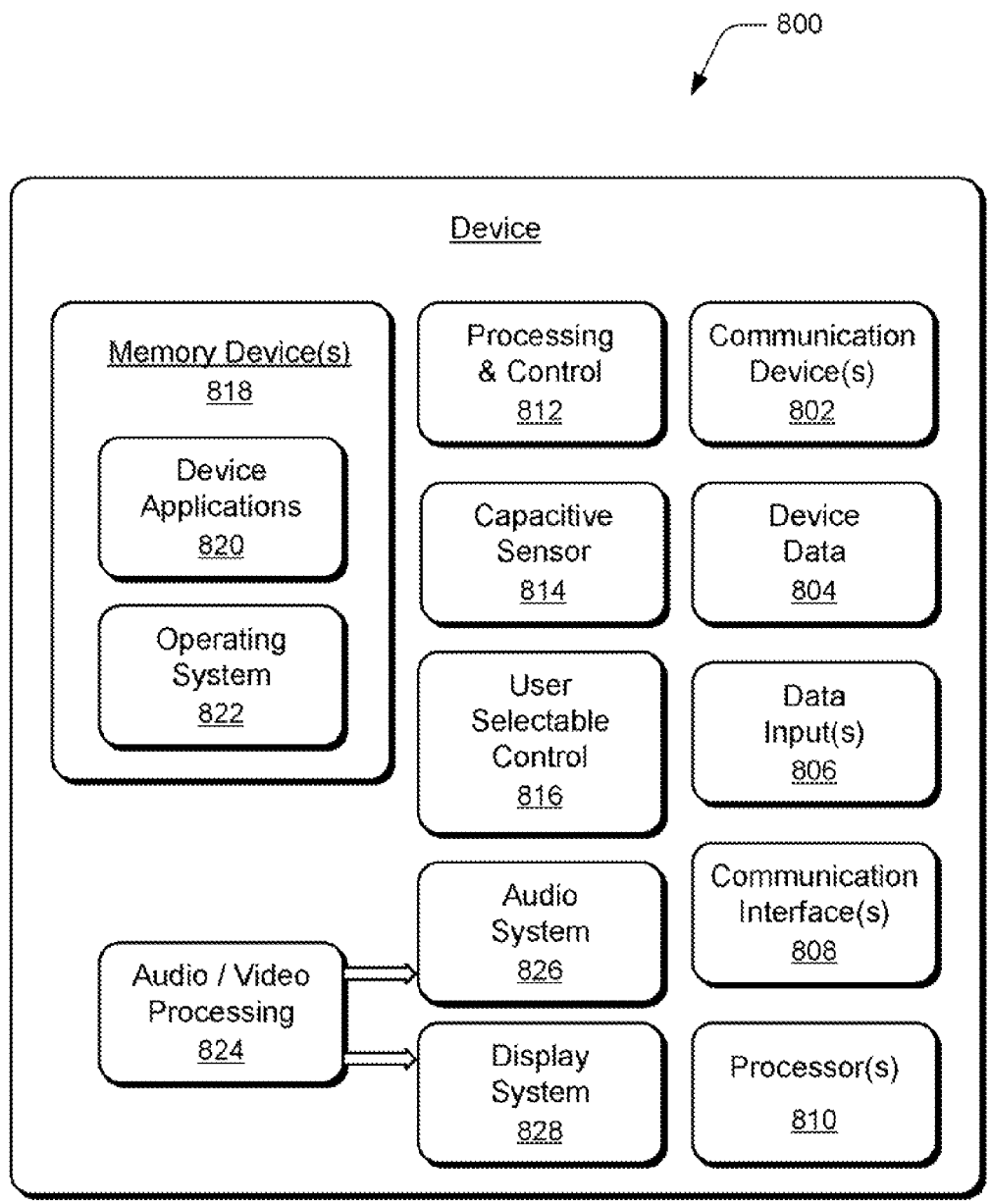
FIG. 8 illustrates various components of an example device that can implement embodiments of an off-center sensor target region.

FIG. 8 illustrates various components of an example device 800 that can be implemented as a device as described with reference to any of the previous FIGS. 1-7. The device may be implemented as any one or combination of a fixed or mobile device, in any form of a consumer, computer, portable, user, communication, phone, navigation, gaming, media playback, and/or electronic device.

The device 800 includes communication devices 802 that enable wired and/or wireless communication of device data 804, such as received data, data that is being received, data scheduled for broadcast, data packets of the data, etc. The device also includes one or more data inputs 806 via which any type of data, media content, and/or inputs can be received, such as user-selectable inputs, messages, music, television content, recorded video content, and any other type of audio, video, and/or image data received from any content and/or data source.

The device 800 also includes communication interfaces 808, such as any one or more of a serial, parallel, network, or wireless interface. The communication interfaces provide a connection and/or communication links between the device and a communication network by which other electronic, computing, and communication devices communicate data with the device.

The device 800 includes one or more processors 810 (e.g., any of microprocessors, controllers, and the like), which process computer-executable instructions to control operation of the device. Alternatively or in addition, the device can be implemented with any one or combination of software, hardware, firmware, or fixed logic circuitry that is implemented in connection with processing and control circuits, which are generally identified at 812.

In embodiments, the device 800 can be implemented with a capacitive sensor 814 and a user selectable control 816 to initiate device functions as described with reference to any the previous FIGS. 1-7. Although not shown, the device can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 800 also includes one or more memory devices 818 that enable data storage, examples of which include random access memory (RAM), non-volatile memory (e.g., read-only memory (ROM), flash memory, EPROM, EEPROM, etc.), and a disk storage device. A disk storage device may be implemented as any type of magnetic or optical storage device, such as a hard disk drive, a recordable and/or rewriteable disc, any type of a digital versatile disc (DVD), and the like. The device 800 may also include a mass storage media device.

A memory device 818 provides data storage mechanisms to store the device data 804, other types of information and/or data, and various device applications 820. For example, an operating system 822 can be maintained as a software application with a memory device and executed on processors 810. The device applications may also include a device manager, such as any form of a control application, software application, signal-processing and control module, code that is native to a particular device, a hardware abstraction layer for a particular device, and so on.

The device 800 also includes an audio and/or video processing system 824 that generates audio data for an audio system 826 and/or generates display data for a display system 728. The audio system and/or the display system may include any devices that process, display, and/or otherwise render audio, video, display, and/or image data. Display data and audio signals can be communicated to an audio device and/or to a display device via an RF (radio frequency) link, S-video link, composite video link, component video link, DVI (digital video interface), analog audio connection, or other similar communication link. In implementations, the audio system and/or the display system are external components to the device. Alternatively, the audio system and/or the display system are integrated components of the example device, such as an integrated capacitive touch-screen.

Although embodiments of an off-center sensor target region have been described in language specific to features and/or methods, the subject of the appended claims is not necessarily limited to the specific features or methods described. Rather, the specific features and methods are disclosed as example implementations of an off-center sensor target region.

The invention claimed is:
1. A device comprising:
a capacitive sensor having a first axis and a second axis, the second axis intersecting the first axis at a center of the capacitive sensor;
a target region located off-center relative to the center of the capacitive sensor, the target region encompassing only a portion of the capacitive sensor;
a selectable control disposed within the target region, the selectable control being a visual icon visible from a surface of the device, wherein the capacitive sensor is configured to detect a touch input on the surface of the device; and a controller configured to compare a center of the touch input to the center of the capacitive sensor, the controller configured to determine that the touch input is a false touch input when the center of the touch input correlates to the center of the capacitive sensor, the selectable control not being selected when the touch input is determined as the false touch input, wherein the center of the touch input is correlated to the center of the capacitive sensor only when the center of the touch input is within a predetermined distance from the center of the capacitive sensor.

2. The device as recited in claim 1, wherein the target region is larger than the selectable control.

3. The device as recited in claim 1, wherein the target region is located off-center relative to the center of the capacitive sensor in one of an x-direction from the center of the capacitive sensor and a y-direction from the center of the capacitive sensor.

4. The device as recited in claim 1, wherein the target region is located off-center relative to the center of the capacitive sensor in both an x-direction and a y-direction from the center of the capacitive sensor.

5. The device as recited in claim 1, wherein the controller is configured to determine the touch input as a valid sensor input when the center of the touch input correlates to a center of the target region, the selectable control being selected when the touch input is determined as the valid sensor input.

6. The device as recited in claim 1, wherein the controller is configured to determine the touch input as a valid sensor input when the center of the touch input does not correlate to the center of the capacitive sensor, the selectable control being selected when the touch input is determined as the valid sensor input, wherein the center of the touch input is not correlated to the center of the capacitive sensor when the center of the touch input is outside the predetermined distance from the center of the capacitive sensor.

7. The device as recited in claim 1, wherein the target region defines an area on the capacitive sensor that, when touched, causes the selectable control to be selected.

8. The device as recited in claim 1, wherein the controller is configured to determine the center of the touch input based on a contact area of the capacitive sensor, the contact area being which portion of the capacitive sensor detects the touch input.

9. The device as recited in claim 1, wherein the selectable control is configured for user selection to initiate a device function of the device.

10. A device, comprising:
a capacitive sensor having a first axis and a second axis, the second axis intersecting the first axis at a center of the capacitive sensor;
a target region located off-center relative to the center of the capacitive sensor, the target region being only a portion of the capacitive sensor, the capacitive sensor configured to detect a touch input;
a selectable control located within the target region, the selectable control being a visual icon visible from a surface of the device, wherein selection of the selectable control initiates a device function;
a processing system to implement a sensor input module that is configured to:
determine a center of the touch input based on a contact area of the touch input on the surface of the device, the contact area being which portion of the capacitive sensor detects the touch input;
compare the center of the touch input to the center of the capacitive sensor;
determine that the touch input to the selectable control is a valid sensor input when the center of the touch input correlates to a center of the target region and the center of the touch input does not correspond to the center of the capacitive sensor, the selectable control being selected when the touch input is determined as the valid sensor input; and
determine that the touch input is an invalid sensor input if the center of the touch input correlates to the center of the capacitive sensor, the selectable control not being selected when the touch input is determined as the invalid sensor input, wherein the center of the touch input is correlated to the center of the capacitive sensor only when the center of the touch input is within a predetermined distance from the center of the capacitive sensor, and the center of the touch input is not correlated to the center of the capacitive sensor when the center of the touch input is outside the predetermined distance from the center of the capacitive sensor.

11. The device as recited in claim 10, wherein the sensor input module is configured to determine that the center of the touch input corresponds to the center of the capacitive sensor when the touch input substantially covers an entire area of the capacitive sensor, wherein when the center of the touch input correlates to the center of the capacitive sensor, the sensor input module is configured to determine that the touch input is invalid.

12. The device as recited in claim 10, wherein the sensor input module is further configured to determine that the touch input to the selectable control is the valid sensor input when the contact area of the touch input does not extend beyond a boundary of the target region and the center of the touch input does not correlate to the center of the capacitive sensor.

13. The device as recited in claim 10, wherein the target region is located off-center relative to the center of the capacitive sensor in one of an x-direction and a y-direction from the center of the capacitive sensor.

14. The device as recited in claim 10, wherein the target region is located off-center relative to the center of the capacitive sensor in both an x-direction and a y-direction from the center of the capacitive sensor.

15. The device as recited in claim 10, wherein the target region has a shape of a circle.

16. The device as recited in claim 10, wherein the target region has a shape that corresponds to a shape of the capacitive sensor.

17. A method, comprising: receiving a sensor input from a capacitive sensor that detects a touch input, the capacitive sensor having a first axis and a second axis, the second axis intersecting the first axis at a center of the capacitive sensor, the capacitive sensor including a target region located off-center relative to the center of the capacitive sensor, the target region being only a portion of the capacitive sensor, a selectable control being located within the target region such that the target region is larger than the selectable control, the selectable control being a visual icon visible from a surface of a device;
determining a center of the touch input based on a contact area of the touch input on the surface of the device;
comparing the center of the touch input to a center of the target region;

comparing the center of the touch input to the center of the capacitive sensor;
determining that the touch input is a valid sensor input when the center of the touch input correlates to the center of the target region, the selectable control being selected when the touch input is determined as the valid sensor input; and
determining that the touch input is an invalid sensor input when the center of the touch input correlates to the center of the capacitive sensor, the selectable control not being selected when the touch input is determined as the invalid sensor input,
wherein the center of the touch input is correlated to the center of the capacitive sensor only when the center of the touch input is within a predetermined distance from the center of the capacitive sensor.

18. The method as recited in claim 17, wherein the selectable control includes a tactile feature.

19. The method as recited in claim 17, further comprising: determining that the center of the touch input corresponds to the center of the capacitive sensor when the touch input substantially covers an entire area of the capacitive sensor.

20. The method as recited in claim 17, wherein the target region has a same shape as the capacitive sensor.

21. A capacitive sensor comprising:
a target region that is offset relative to a center of the capacitive sensor, the target region being only a portion of the capacitive sensor configured to receive a touch input for a visual icon that, when touched, initiates a device function,
wherein the target region is configured such that the touch input is determined as an invalid sensor input when a center of the touch input correlates to the center of the capacitive sensor and the touch input is determined as a valid sensor input when the center of the touch input does not correlate to the center of the capacitive sensor,
wherein the center of the touch input is correlated to the center of the capacitive sensor only when the center of the touch input is within a predetermined distance from the center of the capacitive sensor, and the center of the touch input is not correlated to the center of the capacitive sensor when the center of the touch input is outside the predetermined distance from the center of the capacitive sensor.

22. The capacitive sensor as recited in claim 21, wherein the selectable control includes a physical indicator on a device and configured for user selection to initiate the device function.

23. The capacitive sensor as recited in claim 21, wherein the selectable control includes a visual indicator on a device and configured for user selection to initiate the device function.

24. The capacitive sensor as recited in claim 21, wherein the target region is offset relative to the center of the capacitive sensor in one of an x-direction from the center of the capacitive sensor and or a y-direction from the center of the capacitive sensor.

25. The capacitive sensor as recited in claim 21, wherein the target region is offset relative to the center of the capacitive sensor in both an x-direction and a y-direction from the center of the capacitive sensor.

* * * * *